United States Patent
Chen et al.

(10) Patent No.: US 8,692,296 B2
(45) Date of Patent: Apr. 8, 2014

(54) SEMICONDUCTOR DEVICES AND MANUFACTURING METHODS THEREOF

(75) Inventors: Chun-Chang Chen, Tainan (TW);
 Shun-Shing Yang, Tainan (TW);
 Shih-Chi Fu, Zhudong Township (TW);
 Wang-Pen Mo, Pingtung (TW);
 Hung-Chang Hsieh, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 13/370,132

(22) Filed: Feb. 9, 2012

(65) Prior Publication Data

US 2013/0207163 A1 Aug. 15, 2013

(51) Int. Cl.
 *H01L 27/118* (2006.01)
 *H01L 21/20* (2006.01)

(52) U.S. Cl.
 USPC .......................................... 257/202; 438/478

(58) Field of Classification Search
 USPC ............. 257/347, E29.273, E33.053, E21.53,
 257/E27.112, E29.151, E29.295, E51.005,
 257/E23.011, E23.062; 438/633, 738, 627,
 438/735, 737, 691
 See application file for complete search history.

(56) References Cited

U.S. PATENT DOCUMENTS

| | | | |
|---|---|---|---|
| 8,349,528 B2 * | 1/2013 | Lipinski et al. | 430/5 |
| 2006/0046484 A1 * | 3/2006 | Abatchev et al. | 438/689 |
| 2006/0134845 A1 * | 6/2006 | Pham et al. | 438/200 |
| 2007/0178388 A1 * | 8/2007 | Lipinski et al. | 430/5 |
| 2008/0119048 A1 * | 5/2008 | Sarma et al. | 438/689 |
| 2010/0291477 A1 * | 11/2010 | Ishigo | 430/5 |

* cited by examiner

*Primary Examiner* — Chuong A Luu
*Assistant Examiner* — Moin Rahman
(74) *Attorney, Agent, or Firm* — Haynes and boone, LLP

(57) ABSTRACT

Semiconductor devices and manufacturing methods thereof are disclosed. In one embodiment, a semiconductor device includes a workpiece with a first region having a plurality of first features and a second region having a plurality of second features proximate the first region. The first region and the second region share a patterning overlap region disposed between the first region and the second region. The patterning overlap region includes a residue feature with an aspect ratio of about 4 or less.

20 Claims, 4 Drawing Sheets

SEMICONDUCTOR DEVICES AND MANUFACTURING METHODS THEREOF

BACKGROUND

Semiconductor devices are used in a variety of electronic applications, such as personal computers, cell phones, digital cameras, and other electronic equipment, as examples. Semiconductor devices are typically fabricated by sequentially depositing insulating or dielectric layers, conductive layers, and semiconductive layers of material over a semiconductor substrate, and patterning the various material layers using lithography to form circuit components and elements thereon.

The semiconductor industry continues to improve the integration density of various electronic components (e.g., transistors, diodes, resistors, capacitors, etc.) by continual reductions in minimum feature size, which allow more components to be integrated into a given area. Certain manufacturing processes of semiconductor devices become more challenging as the sizes of the devices decrease, such as the patterning of the various material layers.

Thus, what are needed in the art are improved patterning methods and manufacturing methods for semiconductor devices.

BRIEF DESCRIPTION OF THE DRAWINGS

For a more complete understanding of the present disclosure, and the advantages thereof, reference is now made to the following descriptions taken in conjunction with the accompanying drawings, in which.

Corresponding numerals and symbols in the different figures generally refer to corresponding parts unless otherwise indicated. The figures are drawn to clearly illustrate the relevant aspects of the embodiments and are not necessarily drawn to scale.

DETAILED DESCRIPTION OF ILLUSTRATIVE EMBODIMENTS

The making and using of the embodiments of the present disclosure are discussed in detail below. It should be appreciated, however, that the present disclosure provides many applicable inventive concepts that can be embodied in a wide variety of specific contexts. The specific embodiments discussed are merely illustrative of specific ways to make and use the disclosure, and do not limit the scope of the disclosure.

Embodiments of the present disclosure are related to methods of manufacturing semiconductor devices and patterning material layers of semiconductor devices. Novel semiconductor devices, manufacturing methods, and patterning methods for semiconductor devices will be described herein.

Figure 1:
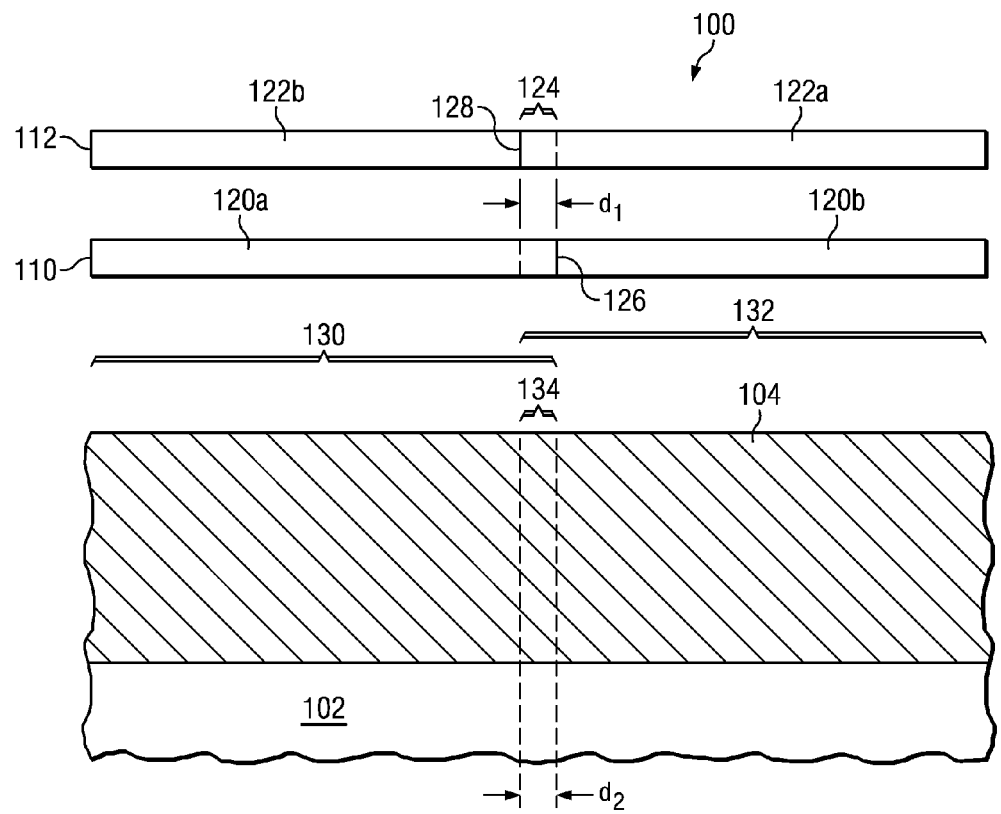
FIGS. 1 through 4 show cross-sectional views of a semiconductor device and lithography masks used to pattern the semiconductor device in accordance with an embodiment of the present disclosure at various stages of manufacturing.

FIGS. 1 through 4 show cross-sectional views of a semiconductor device 100 and lithography masks 110 and 112 used to pattern the semiconductor device 100 in accordance with an embodiment of the present disclosure at various stages of manufacturing. Referring first to FIG. 1, the semiconductor device 100 includes a workpiece 102. The workpiece 102 may include a semiconductor substrate comprising silicon or other semiconductor materials and may be covered by an insulating layer, for example. The workpiece 102 may also include other active components or circuits, not shown. The workpiece 102 may comprise silicon oxide over single-crystal silicon, for example. The workpiece 102 may include other conductive layers or other semiconductor elements, e.g., transistors, diodes, etc. Compound semiconductors, GaAs, InP, Si/Ge, or SiC, as examples, may be used in place of silicon. The workpiece 102 may comprise a silicon-on-insulator (SOI) or a germanium-on-insulator (GOI) substrate, as examples.

A material layer 104 to be patterned is formed over the workpiece 102. In some embodiments, the material layer 104 comprises a conductive material, a semiconductive material, or a combination or multiple layers thereof. The material layer 104 may comprise polysilicon or other semiconductors and may have an optional silicide layer formed on a top surface thereof, as one example. The material layer 104 may alternatively comprise other materials. The material layer 104 may comprise a single layer of material or multiple layers of material, for example.

Figure 3:
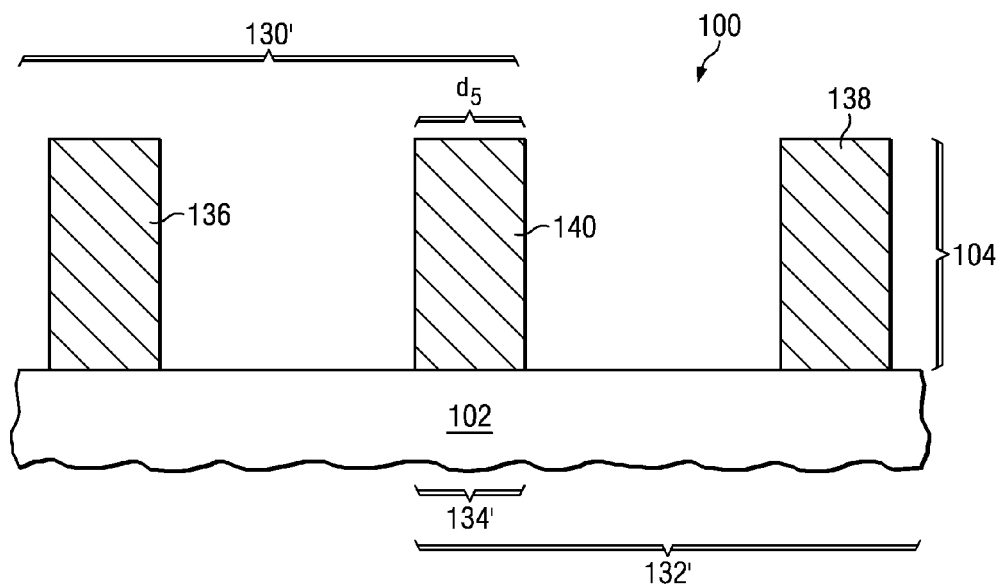

The workpiece 102 comprises a first region 130 in which the material layer 104 will be patterned with a first pattern and a second region 132 where the material layer 104 will be patterned with a second pattern. The second pattern is different than the first pattern and may comprise different sizes or types of features than the first pattern, and thus two separate lithography masks 110 and 112 are used to pattern the first and second patterns. Both lithography masks 110 and 112 are shown in FIGS. 1 and 3; however, each lithography mask 110 and 112 is used separately, e.g., sequentially, in two exposure steps, to pattern the material layer 104. Only one first region 130 and one second region 132 are shown in the drawings; alternatively, a plurality of first regions 130 and second regions 132 may be formed across the surface of the workpiece 102, for example, not shown.

The first region 130 may comprise a low power logic region comprising low power logic devices and the second region 132 may comprise a non-volatile memory region including non-volatile memory devices such as for Flash memory devices, as examples. Alternatively, the first region 130 and the second region 132 may comprise different types of device functions. The features to be formed in the first and second regions 130 and 132 may comprise gates of transistors or other features, for example. The features to be formed in the first and second regions 130 and 132 comprise the same material and are formed from the same material layer.

The first lithography mask 110 includes a pattern 120a for features in the first region 130 of the workpiece 102. The pattern 120a may comprise holes or apertures having predetermined shapes for the features in the first region 130. The first lithography mask 110 also includes a region 120b that blocks the second region 132 of the workpiece 102 during exposure. The region 120b may be clear or opaque, depending on whether a positive or negative photoresist is used, for example Likewise, the second lithography mask 112 includes a pattern 122a for features in the second region 132 of the workpiece 102. The second lithography mask 112 includes a region 122b that blocks the first region 132 of the workpiece 102 during exposure.

An overlap region 134 resides at the boundary of the first region 130 and the second region 132 of the workpiece 102. The overlap region 134 may be unintended due to a slight misalignment of the lithography masks 110 and 112 during the lithography process, for example. The overlap region 134 of the semiconductor device 100 is caused by an overlap region 124 of the lithography masks 110 and 112, as shown. The overlap region 134 may comprise a variety of shapes in a top view, such as elongated lines that are straight or have turns. In some embodiments, the overlap region 134 may comprise a ring-shape in a top view. The shape of the overlap region 134 is a function of the shape of the boundary between the first and second regions 130 and 132. The overlap region 134 is also referred to herein as a patterning overlap region that is shared by the first region 130 and the second region 132, disposed between the first region 130 and the second region 132.

The edge 126 of the first pattern 120a is misaligned with the edge 128 of the second pattern 122a, as shown on the lithography masks 110 and 112 in FIG. 1, creating the overlap region 124 of the lithography masks 110 and 112. The overlap region 124 has a width comprising dimension $d_1$. The overlap region 124 of the lithography masks 110 and 112 causes the formation of an overlap region 134 on the workpiece 102 having a dimension $d_2$. Dimension $d_2$ may comprise about 20 nm or less in some embodiments, and may comprise about 13 nm in some applications, as examples.

A 1:1 lithography exposure process is illustrated in the drawings; alternatively, the lithography process may comprise other exposure ratios, such as 2:1, 4:1 or other exposure ratios wherein the features formed are smaller than the apertures in the masks 110 and 112, or a 1:2 ratio or other exposure ratios wherein the features formed are larger than the apertures in the masks 110 and 112, for example.

The overlap region 124 of the lithography masks 110 and 112, if left unaltered as shown in FIG. 1, would result in the formation of high aspect residue features formed in the overlap region 134 of the workpiece 134 in some embodiments. For example, if the material layer 104 comprises a thickness of about 100 nm or greater, and the thickness or dimension $d_2$ of a residue feature formed in the overlap region 134 is about 13 nm, the aspect ratio of the residue feature would be 100/13=about 8. A high aspect ratio of such a residue feature is undesirable in some embodiments, because the residue is tall and thin, and may peel and cause contamination during the manufacturing processes of the semiconductor device 100, resulting in defect issues and decreased yields.

In some applications, the overlay region 124 of the lithography masks 110 and 112 and thus the overlay region 134 of the workpiece 102 cannot be avoided due to tool and process limitations. The overlay region 134 may be caused by an overlay shift, e.g., of aligning the lithography masks 110 and 112 to the workpiece 102. The thickness of the material layer 104 cannot be reduced in some applications due to the requirements of the material layer 104 in the end product, for example. The peeling and contamination problems can be more pronounced if the material layer 104 is formed over uneven topography, e.g., over previously deposited and patterned material layers (not shown in FIGS. 1 through 4; see FIGS. 5 through 8).

Figure 2:
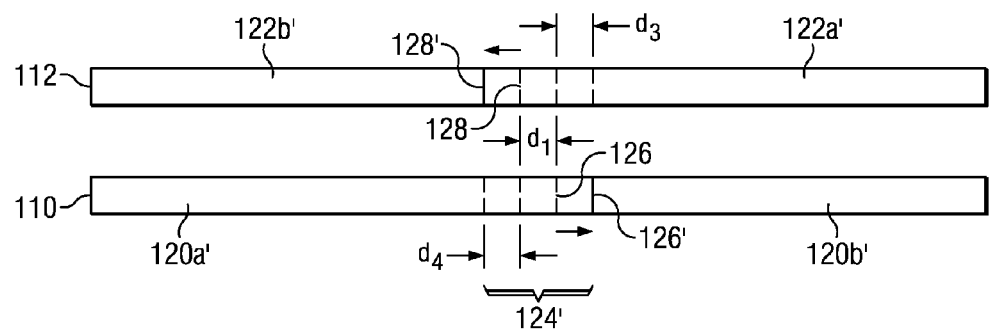

Embodiments of the present disclosure resolve the potential issues that can occur due to the overlay regions 124 and 134 of the masks 110 and 112 and the workpiece 102, respectively, by increasing the size of the overlap region 124 on the masks 110 and 112 and thus also increasing the size of the overlap region 134 of the semiconductor device 100, reducing the aspect ratio of a residual feature 140 (see FIGS. 3 and 4) formed in the overlap region 134'. Referring next to FIG. 2, the overlap region 124 is increased to produce an overlap region 124' of the lithography masks 110 and 112. The overlap region 124' is increased in some embodiments by moving the edge 126 of the first pattern 120a of the first lithography mask 110 to the right by a dimension $d_3$ to edge 126'. The first pattern comprises an altered first pattern 120a'. Region 120b is also altered to form region 120b'. The overlap region 124' is increased in other embodiments by moving the edge 128 of the second pattern 122a of the second lithography mask 112 to the left by a dimension $d_4$ to edge 128'. The second pattern comprises an altered second pattern 122a'. Region 122b is also altered to form region 122b'. Alternatively, in other embodiments, both edges 126 and 128 are moved to edges 126' and 128', respectively, as shown in FIG. 2. Either the first lithography mask 110, the second lithography mask 112, or both the first lithography mask 110 and the second lithography mask 112 may be altered to increase the overlap region 124 to altered overlap region 124' having an increased width comprising dimension $(d_1+d_3)$, $(d_1+d_4)$, or $(d_1+d_3+d_4)$.

The altered lithography masks 110 and 112 shown in FIG. 2 are then fabricated and used to pattern the material layer 104 with the first pattern 120a and the second pattern 122a, forming first features 136 in the first region 130' of the workpiece 102, forming second features 138 in the second region 132' of the workpiece 102, and forming residue feature 140 in the overlap region 134', as shown in FIG. 3. The residue feature 140 is also referred to herein as a patterning residue feature and comprises material of the same material layer 104 that the first features 136 and the second features 138 are formed of.

To pattern the material layer 104, a layer of photoresist (not shown) may be formed over the material layer 104. Portions of the layer of photoresist are exposed using the lithography masks 110 and 112 of FIG. 2 as masks. Two layers of photoresist may be used to pattern the material layer 104 in some embodiments, wherein a first layer of photoresist is patterned using the first lithography mask 110, and portions of the material layer 104 in the first region 130 are etched away using the first layer of photoresist as a mask during a first etching process. The first layer of photoresist is removed, and a second layer of photoresist is formed over the material layer 104. The second layer of photoresist is then patterned using the first lithography mask 110, and portions of the material layer 104 are etched away in the second region 132 using the second layer of photoresist as a mask during a second etching process. In other embodiments, the two lithography masks 110 and 112 are used to pattern a single layer of photoresist in the first region 130 and the second region 132 of the workpiece 102, and the layer of photoresist is etched using the layer of photoresist as a mask in a single etching step.

Alternatively, the material layer 104 may be patterned using a direct etching process, using a photoresist or without using a photoresist, depending on the type of material of the material layer 104. An optional hard mask (not shown) may be used, wherein the hard mask is formed over the material layer 104, and the layer of photoresist is formed over the hard mask. The layer of photoresist is used to pattern the hard mask. The hard mask, or the hard mask and the layer of photoresist, is used as an etch mask to pattern the underlying material layer 104, in these embodiments.

Only one first feature 136 is shown in the first region 130' and only one second feature 138 is shown in the second region 132' in FIG. 3; alternatively, a plurality of first features 136 and second features 138 may be formed in the first and second regions 130' and 132', respectively. The residue feature 140 has a width comprising dimension $d_5$ of the overlap region 134' of the workpiece 102. The residue feature 140 extends in and out of the paper by length corresponding to the pattern of the lithography masks 110 and 112 of FIG. 2 in a top view.

The residue feature 140 comprises a non-functional residue that is formed at the boundary of the first and second regions 130' and 132'.

Figure 4:
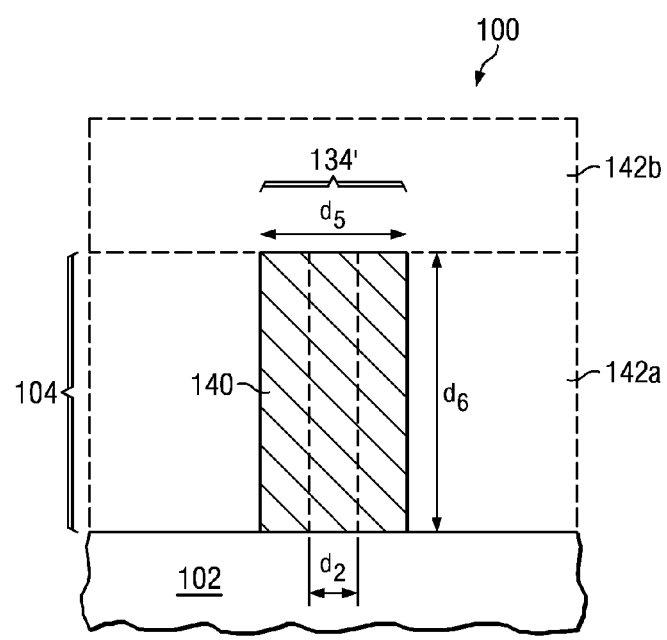

Referring next to FIG. 4, a more detailed view of the residue feature 140 is shown. The altered overlap region 124' of the lithography masks 110 and 112 comprising the dimension $(d_1+d_3)$, $(d_1+d_4)$, or $(d_1+d_3+d_4)$ causes the formation of an overlap region 134' on the material layer 104 having an increased width comprising dimension $d_5$ that is greater than the dimension $d_2$ that the unaltered overlap region 134 (see FIG. 1) would have had, if the edges 126 and 128 had not been moved to edges 126' and 128' (see FIG. 2) in accordance with embodiments of the present disclosure. The increased dimension $d_5$ of the overlap region 134' comprises an amount that causes the aspect ratio of the residue feature 140 to be about 4 or less in some embodiments. For example, the thickness comprising dimension $d_6$ of the material layer 104 may comprise about 100 nm, and the width comprising dimension $d_5$ of the residue feature 140 may comprise about 25 nm (or greater), resulting in an aspect ratio of 100/25=about 4. The residue feature 140 in the overlap region 134' having the increased width comprising dimension $d_5$ is advantageous because the reduced aspect ratio residue feature 140 is less likely to peel, reducing or eliminating potential contamination problems in the manufacturing process and increasing yields.

After the material layer 104 is patterned, insulating material layers 142a and 142b may be formed over the features 136 and 138 (see FIG. 3) and over the residue feature 140, as shown in phantom in FIG. 4. The manufacturing process is then continued to complete the fabrication of the semiconductor device 100.

In the embodiment shown in FIGS. 1 through 4, the material layer 104 is formed over a substantially flat workpiece 102. Embodiments of the present disclosure are also beneficial for use in applications where one or more material layers have been formed over the workpiece 102 and have been previously patterned, as shown in FIGS. 5 through 8. The first and second lithography masks 110 and 112 having an increased overlap region 134' described for the embodiment of FIGS. 2 through 4 may also be used to either mask or unmask the regions 130 and 132 of the workpiece 102 in various combinations or applications for patterning purposes. Cross-sectional views of a semiconductor device 100 at various stages of manufacturing in accordance with another embodiment are shown, wherein material layer 144 is formed over the workpiece 102 prior to depositing the material layer 104 to be patterned in accordance with embodiments described herein, using lithography masks 110 and 112 shown in FIG. 2. Like numerals are used to describe the various elements as were used in the previous drawings, and to avoid repetition, each element is not described again herein.

In some embodiments, the material layer 144 may be formed over the workpiece 102 before the material layer 104 is formed. The material layer 144 may be completely or partially removed from the second region 132' before depositing the material layer 104, but left remaining in the first region 130', or the material layer 144 may be left remaining in the second region 132'.

The material layer 144 may comprise a single material layer of insulating, semiconductive, or conductive material, or the material layer 144 may comprise multiple layers such as layers 148 and 146. In the example shown, material layer 146 may comprise a semiconductive material layer comprising polysilicon or other semiconductors, and material layer 148 may comprise a layer of insulating material such as an oxide or a nitride, as examples. The material layers 104, 146 and 148 may comprise a thickness of about 100 nm or less in some embodiments, although alternatively, the material layers 104, 146, and 148 may comprise other dimensions. One or more of the material layers 146 and 148 may be removed from the second region 132' before depositing the material layer 104, as shown in FIG. 8, or the material layers 146 and 148 may be left remaining before the material layer 104 is deposited, as shown in FIGS. 5, 6, and 7.

Figure 5:
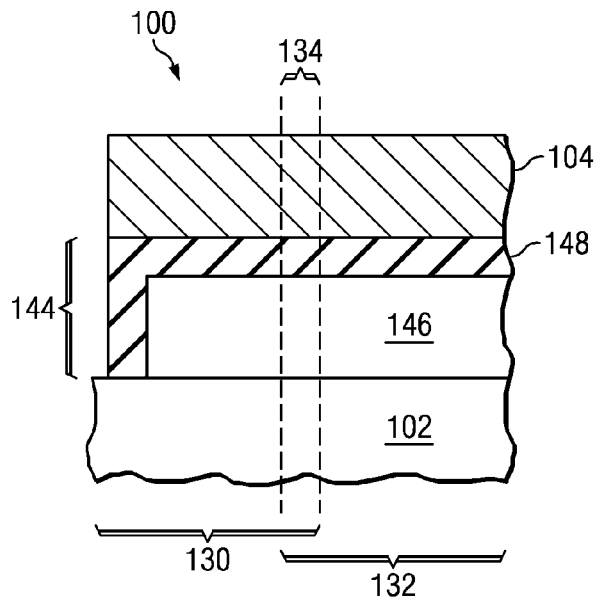
FIGS. 5 through 8 show cross-sectional views of a semiconductor device at various stages of manufacturing in accordance with another embodiment.
Figure 6:
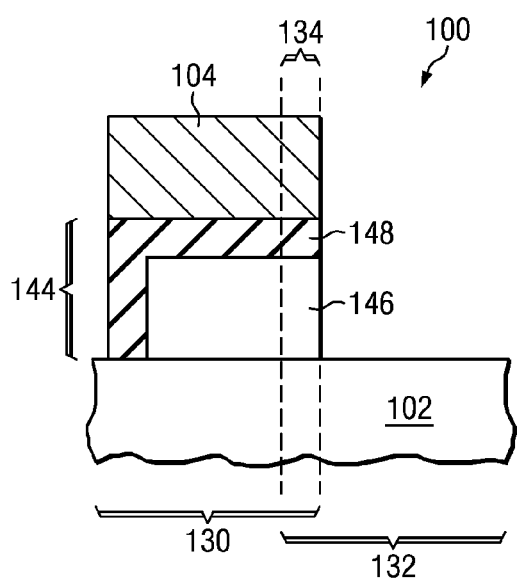
Figure 7:
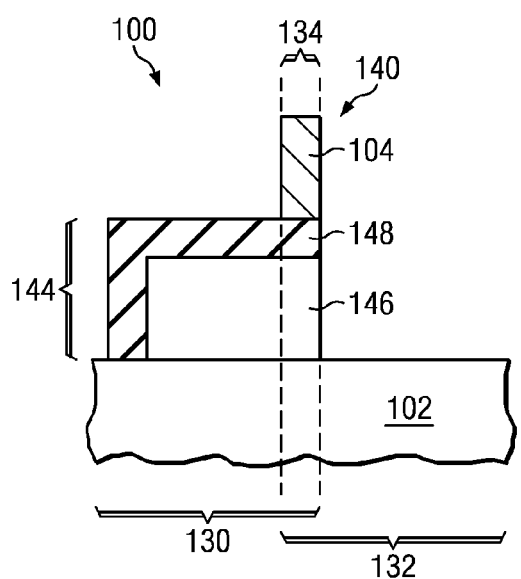
Figure 8:
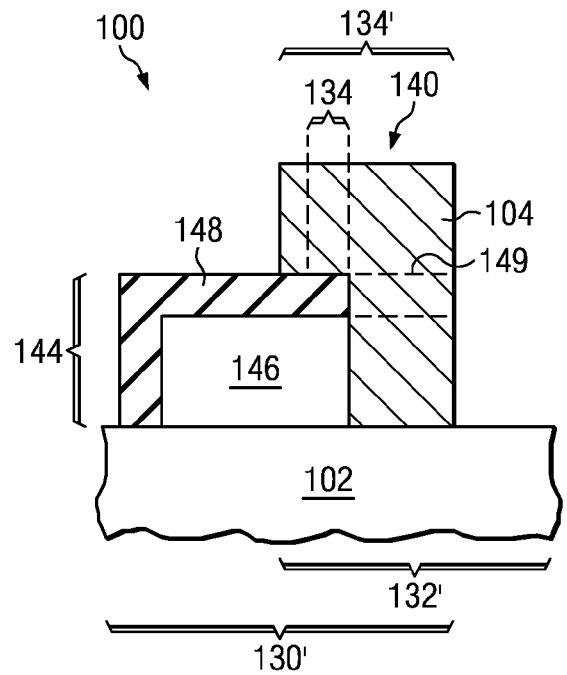

FIGS. 5 through 7 illustrate semiconductor devices 100 before the implementation of an embodiment of the present disclosure. In FIG. 5, an example is shown of the material layer 104 formed over previously formed material layer 144, illustrating an unaltered overlap region 134. FIG. 6 shows a subsequent step wherein an unaltered first lithography mask has been used to pattern the material layer 104 and also the underlying material layer 144. Both material layers 104 and 144 have been removed from the second region 132, with both material layers 104 and 144 being left remaining in the unaltered overlap region 134. FIG. 7 shows a subsequent step after an unaltered second lithography mask 112 has been used to pattern the material layer 104, removing it from the first region 130. A tall thin residue feature 140 of the material layer 104 is left remaining over the material layer 144 in the unaltered overlap region 134, which is undesired yet is avoided by embodiments of the present disclosure. FIG. 8 illustrates an application of the present disclosure implemented in a multiple material layer structure to avoid forming such a high aspect ratio residue feature, by the use of an increased overlap region 134'. The material layer 104 may reside over the material layer 144 in a portion of the overlap region 134' or in the entire overlap region 134', as shown in phantom at 149, depending on the use of the lithography masks 110 and 112 to pattern the various material layers 104 and 144, for example. The residual feature 140 formed in the increased overlap region 134' has a decreased aspect ratio, advantageously.

Figure 9:
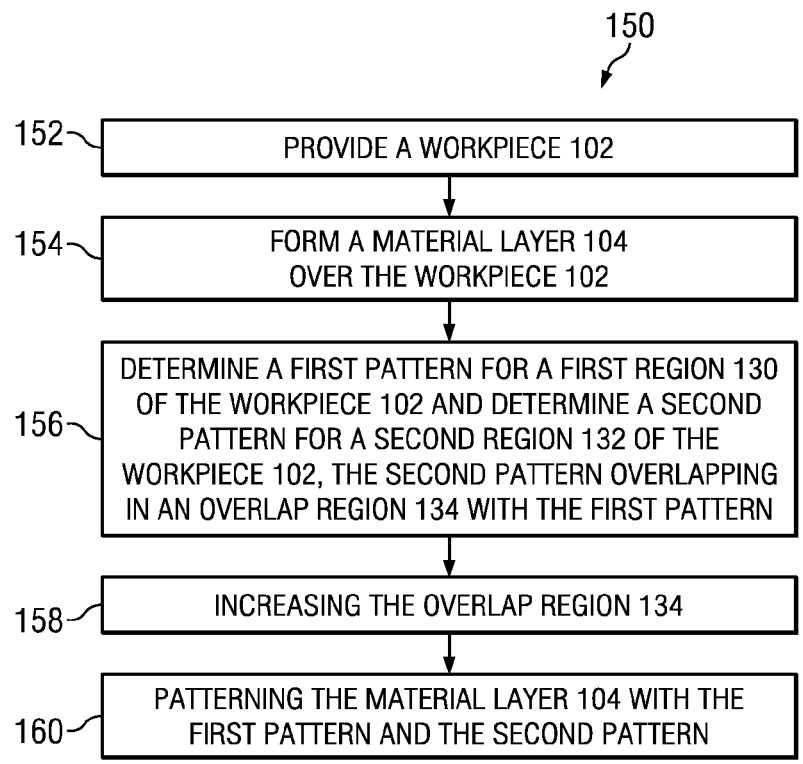
FIG. 9 is a flow chart illustrating a method of patterning a material layer of a semiconductor device in accordance with an embodiment.

FIG. 9 is a flow chart 150 illustrating a method of patterning a material layer 104 of a semiconductor device 100 in accordance with an embodiment. First, a workpiece 102 is provided (step 152), and a material layer 104 is formed over the workpiece 102 (step 154). A pattern for a first pattern for a first region 130 of the workpiece 102 and a pattern for a second pattern for a second region 132 of the workpiece 102 is determined (step 156). The second pattern overlaps with the first pattern in an overlap region 134. The overlap region 134 is increased (step 158), e.g., by forming an altered overlap region 124' of the masks 110 and 112 (FIG. 2) and an altered overlap region 134' of the workpiece 102 (FIG. 4). Increasing the overlap region 134 may be achieved by altering the first pattern or altering the second pattern, or by altering both the first pattern and the second pattern, as described with reference to FIG. 2. The material layer 104 is then patterned with the first pattern and the second pattern (step 160).

Embodiments of the present disclosure include methods of manufacturing semiconductor devices 100 and semiconductor devices 100 that have been manufactured using the methods described herein. Embodiments of the present disclosure also include novel methods of patterning material layers 104 of semiconductor devices 100.

Advantages of embodiments of the disclosure include providing novel patterning and manufacturing methods wherein residue features 140 have decreased aspect ratios, preventing or reducing peeling and contamination in manufacturing process flows. Embodiments of the present disclosure solve peeling issues for high topography production of semiconductor devices 100, such as peeling of polysilicon lines. The patterning and manufacturing methods are easily implementable in manufacturing process flows for semiconductor devices 100.

In accordance with one embodiment of the present disclosure, a semiconductor device includes a workpiece with a first region comprising a plurality of first features and a second region comprising a plurality of second features proximate the first region. The first region and the second region share a patterning overlap region disposed between the first region and the second region. The patterning overlap region comprises a residue feature with an aspect ratio of about 4 or less.

In another embodiment, a semiconductor device includes a workpiece, a material layer disposed over the workpiece, and a plurality of first features disposed in the material layer in a first region of the workpiece. A plurality of second features is disposed in the material layer in a second region of the workpiece proximate the first region. The semiconductor device includes a patterning overlap region disposed between and shared by the first region and the second region, the patterning overlap region comprising a residue patterning feature with a reduced aspect ratio disposed in the material layer. The patterning overlap region comprises a width of about 20 nm or less. An insulating material is disposed over the plurality of first features, the plurality of second features, and the residue feature.

In another embodiment, a method of patterning a material layer of a semiconductor device is disclosed. The method includes providing a workpiece, and forming the material layer over the workpiece. A first pattern for the material layer in a first region of the workpiece and a second pattern for the material layer in a second region of the workpiece are determined. The second pattern overlaps in an overlap region with the first pattern. The method includes increasing the overlap region, and patterning the material layer with the first pattern and the second pattern.

In accordance with another embodiment, a method of patterning a material layer of a semiconductor device includes providing a workpiece, and forming the material layer over the workpiece. The method includes determining a first pattern for a first region of the workpiece and a second pattern for a second region of the workpiece. The second pattern overlaps in an overlap region with the first pattern. The overlap region is increased by altering the first pattern, the second pattern, or both the first pattern and the second pattern. A first lithography mask comprising the first pattern or the altered first pattern is fabricated, and a second lithography mask comprising the second pattern or the altered second pattern is fabricated. The method includes patterning the material layer using the first lithography mask and the second lithography mask.

In accordance with yet another embodiment, a method of manufacturing a semiconductor device is disclosed. The method includes providing a first pattern for a first region of the semiconductor device and a second pattern for a second region of the semiconductor device. The second pattern overlaps in an overlap region with the first pattern. The method includes increasing the overlap region, fabricating a first lithography mask comprising the first pattern, and fabricating a second lithography mask comprising the second pattern. A workpiece is provided, and a material layer is formed over the workpiece. The material layer is patterned using the first lithography mask and the second lithography mask.

Although embodiments of the present disclosure and their advantages have been described in detail, it should be understood that various changes, substitutions and alterations can be made herein without departing from the spirit and scope of the disclosure as defined by the appended claims. For example, it will be readily understood by those skilled in the art that many of the features, functions, processes, and materials described herein may be varied while remaining within the scope of the present disclosure. Moreover, the scope of the present application is not intended to be limited to the particular embodiments of the process, machine, manufacture, composition of matter, means, methods and steps described in the specification. As one of ordinary skill in the art will readily appreciate from the disclosure of the present disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

What is claimed is:

1. A method of manufacturing a semiconductor device, the method comprising:
    providing a workpiece;
    forming a material layer over the workpiece;
    determining a first pattern for the material layer in a first region of the workpiece and a second pattern for the material layer in a second region of the workpiece, the second pattern overlapping in an overlap region with the first pattern;
    determining whether patterning the material layer with the first pattern and the second pattern would form a residue feature in the overlap region having an aspect ratio greater than a predetermined value;
    increasing the overlap region when it is determined that patterning the material layer with the first pattern and the second pattern would form the residue feature in the overlap region having the aspect ratio greater than the predetermined value; and
    patterning the material layer with the first pattern and the second pattern.

2. The method according to claim 1, wherein patterning the material layer comprises patterning the material layer with a first lithography mask comprising the first pattern and patterning the material layer with a second lithography mask comprising the second pattern.

3. The method according to claim 2, wherein increasing the overlap region comprises altering the first pattern of the first lithography mask or altering the second pattern of the second lithography mask.

4. The method according to claim 2, wherein increasing the overlap region comprises altering both the first pattern of the first lithography mask and the second pattern of the second lithography mask.

5. The method according to claim 1, wherein patterning the material layer comprises forming a layer of photoresist over the material layer, patterning the layer of photoresist, and using the layer of photoresist as a mask to pattern the material layer.

6. The method according to claim 1, wherein patterning the material layer comprises forming the residue feature in the overlap region.

7. The method according to claim 6, wherein increasing the overlap region increases a width of the residue feature in the overlap region.

8. The method according to claim 6, wherein increasing the overlap region reduces the aspect ratio of the residue feature in the overlap region below the predetermined value.

9. The method according to claim 6, wherein patterning the material layer comprises forming a plurality of first features in the first region and forming a plurality of second features in the second region.

10. The method according to claim 6, wherein forming the material layer comprises forming a second material layer, further comprising forming a first material layer over the workpiece, before forming the second material layer, and patterning the first material layer, removing the first material layer from the second region but not the first region.

11. The method according to claim 10, wherein forming the first material layer comprises forming a layer of semiconductive material and a layer of insulating material disposed over the layer of semiconductive material.

12. The method according to claim 10, wherein removing the first material layer further comprises removing a first portion of the first material layer from the overlap region, leaving a second portion of the first material layer left remaining in the overlap region.

13. The method according to claim 12, wherein forming the residue feature comprises forming the residue feature over the workpiece and over the second portion of the first material layer in the overlap region.

14. A method of manufacturing a semiconductor device, the method comprising:
   forming a material layer over a partially fabricated integrated circuit;
   determining a first pattern for the material layer in a first region of the partially fabricated integrated circuit and a second pattern for the material layer in a second partially fabricated integrated circuit of the workpiece, the second pattern overlapping in an overlap region with the first pattern;
   determining whether patterning the material layer with the first pattern and the second pattern would form a residue feature in the overlap region having an aspect ratio greater than a predetermined value;
   spatially expanding the overlap region when it is determined that patterning the material layer with the first pattern and the second pattern would form the residue feature in the overlap region having the aspect ratio greater than the predetermined value; and
   photolithographically patterning the material layer with the first pattern and the second pattern.

15. The method of claim 14 wherein the first region comprises a low power logic region of the integrated circuit and the second region comprises a non-volatile memory region of the integrated circuit.

16. The method of claim 14 wherein the step of spatially expanding the overlap region comprises altering at least one of the first pattern and the second pattern.

17. The method of claim 14 wherein the material layer comprises polysilicon.

18. The method of claim 14 wherein photolithographically patterning the material layer comprises using a first lithography mask to form the first pattern in the material layer and using a second lithography mask to form the second pattern in the material layer.

19. The method of claim 14 wherein the overlap region corresponds to an area on the partially fabricated integrated circuit having a surface with uneven topography.

20. The method of claim 14 wherein the step of spatially expanding the overlap region includes moving an edge of a feature of at least one of the first pattern and the second pattern in a direction away from a center of the overlap region.

* * * * *